United States Patent [19]
Suresh

[11] Patent Number: 5,920,207
[45] Date of Patent: Jul. 6, 1999

[54] ASYNCHRONOUS PHASE DETECTOR HAVING A VARIABLE DEAD ZONE

[75] Inventor: Maya Suresh, Santa Clara, Calif.

[73] Assignee: Hewlett Packard Company, Palo Alto, Calif.

[21] Appl. No.: 08/964,850

[22] Filed: Nov. 5, 1997

[51] Int. Cl.[6] ..................................................... H03L 7/00
[52] U.S. Cl. ...................... 327/3; 327/2; 327/8; 331/25
[58] Field of Search ............................. 327/3, 7, 12, 156, 327/15, 5, 8; 331/25

[56] References Cited

U.S. PATENT DOCUMENTS 4,751,469  6/1988  Nakagawa et al. ........................... 327/7
5,142,246  8/1992  Petersson ..................................... 331/11

Primary Examiner—Dinh T. Le
Attorney, Agent, or Firm—Brian R. Short

[57] ABSTRACT

An asynchronous digital phase detector. The digital phase detector includes an asynchronous state machine which simulates an edge triggered J-K flip flop. Additionally, the digital phase detector includes a reset line. The asynchronous state machine is implemented with logic which provides for optimal phase detector sensitivity and minimal dead zone. The logic within the digital phase detector is implemented with pass-transistors. The channel widths of the pass-transistors are selectively widened or narrowed to further increase the sensitivity of the phase detector.

11 Claims, 4 Drawing Sheets

| STATE ENCODING $y_1 y_2 y_3 y_4$ | JK--> PRESENT STATE | NEW STATE 00 | 01 | 11 | 10 |
|---|---|---|---|---|---|
| 0011 | S | S/O | S/O | U/1 | T/1 |
| 1001 | T | T/1 | S/O | V/0 | T/1 |
| 1111 | U | T/1 | U/1 | U/1 | T/1 |
| 0000 | V | S/O | S/O | V/0 | V/0 |

INPUTS / NEXT STATE/OUTPUT

*Figure 5*

ASYNCHRONOUS PHASE DETECTOR HAVING A VARIABLE DEAD ZONE

FIELD OF INVENTION

This invention relates generally to a digital phase detector. In particular, it relates to an asynchronous digital phase detector which is configured to minimize the size of a phase detector dead zone.

BACKGROUND

Digital phase detectors are used in phase-locked loops and delay-locked loops. Phaselocked loops circuits are widely used in electronic systems to generate an accurate replica of an incoming signal, or for frequency synthesis. For example, in a computer, a phase-locked loop is to used by a microprocessor to generate an on-chip clock signal from an off-chip clock signal. Within the phase-locked loop, the digital phase detector is used to generate an error voltage proportional to the phase difference between a reference signal and a signal generated by a voltage controlled oscillator (VCO). The error voltage is use to tune the VCO so that the VCO is phase locked with the reference signal.

Delay-locked loops are also widely used in electronic systems. Delay-locked loops can be used realign the edges of internal clock and data signals which have been skewed during the distribution of the signals. Circuitry through which the internal clock and data signals are distributed induce undesirable delay which causes clock and data signals to reach destination circuit elements delayed in time. The delay-lock loop provides additional delay in the distributed signals so that the edges of the signals are aligned with, for example, a master clock signal. Within a delay-locked loop, the phase detector is used to generated an error signal which is proportional to the phase difference between the master clock and the distributed signal. Typically, the error signal is used to tune a programmable delay line which re-aligns the edges of the distributed signal with the master clock.

FIG. I shows a digital phase detector 10 which includes a reference clock input Ref_CLK, a feedback signal input FDB_CLK and an output Detector_Out. The digital phase detector 10 generates a signal at the output Detector_Out which reflects the phase differences between the reference clock input Ref_CLK and the feedback signal input FDB_CLK. Generally, the signal Detector_Out at the output of the digital phase detector 10 will only change states or voltage levels upon the occurrence of an edge or a voltage potential level of either the signal input Ref_CLK or the signal input FDB_CLK.

FIG. 2 includes Traces 2A, 2B, 2C which represent signals at the inputs and the resultant output of the digital phase detector 10 shown in FIG. 1. Trace 2A shows a reference clock input Ref_CLK signal. Trace 2B shows a feedback signal input FDB_CLK signal. Trace 2C shows an output Detector_Out response to the inputs shown in Traces 2A, 2B.

Some key features of the signals should be noted. First, if the output Detector_Out is at a lower of two states upon the occurrence of a positive edge at the reference clock input Ref_CLK signal, the output Detector_Out will transition to a higher state. If the output Detector_Out is at the higher of the two states upon the occurrence of a positive edge at the reference clock input Ref_CLK signal, the output Detector_Out will remain at the higher state. If the output Detector_Out is at the higher state upon the occurrence of a positive edge at the feedback signal input FDB_CLK signal, the output Detector_Out will transition to the lower state. If the output Detector_Out is at the lower state upon the occurrence of a positive edge at the feedback signal input FDB_CLK signal, the output Detector_Out will remain at the lower state. Further, if the reference clock input Ref_CLK signal and the feedback signal input FDB_CLK signal both transition from the lower state to the higher state at approximately the same time, the output Detector_Out toggles to the one of the two states the output Detector_Out is not in upon the transition of the two inputs.

Dashed lines 20, 24 show the output Detector_Out transitioning to a high state due to a positive edge transition of the reference clock input Ref_CLK signal. Dashed lines 22, 26, 32 show the output Detector_Out transitioning to a low state due to a positive edge transition of the feedback signal input FDB_CLK signal. Dashed lines 28, 30 depict a dead zone of the digital phase detector. The output Detector_Out of the phase detector will toggle due to the occurrence of positive transitioning edges of both the reference clock input Ref_CLK signal and the feedback signal input FDB_CLK signal within the dead zone of the digital phase detector. The dead zone of the phase detector is the period of time defined by the dashed lines 28, 30 in which the output Detector_Out of the phase detector will toggle if the two inputs transition high. If the positive edges of the two inputs are separated apart in time so that either positive edge is not in the dead zone time defined by the dashed lines 28, 30, the output Detector_Out will not toggle. Rather, the phase detector will respond to positive edge transitions of the inputs as previously described.

The larger the size of the dead zone period of time defined by the dashed line 28, 30, the lower the operational frequency of the digital phase detector. Therefore, it is desirable to minimize the size of the digital phase detector dead zone.

The reference clock input Ref_CLK signal to the digital phase detector can be noisy. Prior art digital phase detectors either require a limitation on the amount of noise within the reference clock input signal, or additional circuitry is required to filter the reference clock input signal.

The prior art digital phase detectors as shown in FIG. 1 can experience instabilities. The instabilities can increase the time required to obtain lock in either phase-locked loops or delay-locked loops.

It is desirable to have a digital phase detector which offers high sensitivity and provides a phase detector dead zone that is smaller than previously possible. The digital phase detector would provide filtering of the reference clock signal input to the digital phase detector. Further, the digital phase detector would provide a reset condition to avoid instabilities of the digital phase detector.

SUMMARY OF THE INVENTION

The present invention includes an asynchronous digital phase detector. Digital logic and the structures of transistors within the phase detector provide a digital phase that has better sensitivity than presently existing phase detectors. Additionally, the digital phase detector has a smaller dead zone than presently existing phase detectors. The smaller dead zone allows the phase detector to properly phase detect high frequency signals. Further, the digital phase detector provides filtering of the reference clock input. Finally, the digital phase detector can include a reset input which allows avoidance of instabilities of the phase detector.

A first embodiment of the invention includes a phase detector. The phase detector includes a phase compare logic block. The phase compare logic block receives a reference signal (RS) and a feedback signal (FS). The compare logic block generates an output signal at a first of two output states when the reference signal transitions from a first voltage potential to a second voltage potential. The compare logic block generates an output signal at a second of two output states when the feedback signal transitions from the first voltage potential to the second voltage potential. The compare logic block toggles the output signal between the first state and the second state when reference signal and the feedback signal transition from the first voltage potential to the second voltage potential at substantially the same time. The phase compare logic block filters more signal noise from the reference signal than from the feedback signal.

A second embodiment of the invention is similar to the first embodiment. For the second embodiment, the phase compare logic block includes an asynchronous state machine which changes states upon the occurrence of a positive reference signal transition, and upon the occurrence of a positive feedback signal transition.

A third embodiment of the invention is similar to the first embodiment. The third embodiment includes a reset signal which drives the output signal to the first state.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 5 is a table which depicts the present states and next states of an asynchronous state machine of the invention.

DETAILED DESCRIPTION

Figure 1:
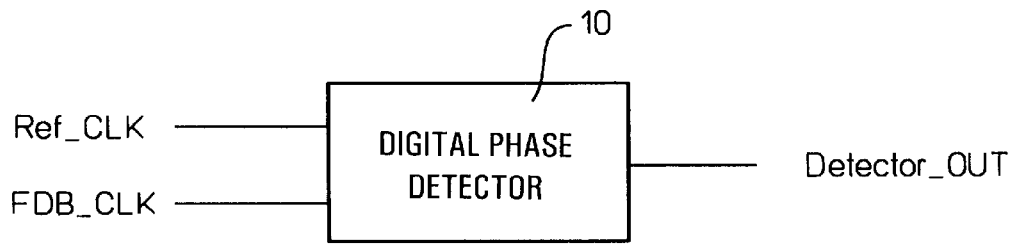
FIG. 1 shows a digital phase detector.

As shown in the drawings for purposes of illustration, the invention is embodied in an asynchronous digital phase detector. The digital phase detector include logic circuitry which increases the sensitivity of the phase detector. Additionally, transistors within the phase detector which are used to implement the logic circuitry can be scaled to further improve the sensitivity of the phase detector. The improved sensitivity of the phase detector provides the phase detector with a smaller dead zone and allows the phase detector to operate at higher frequencies.

Figure 3:
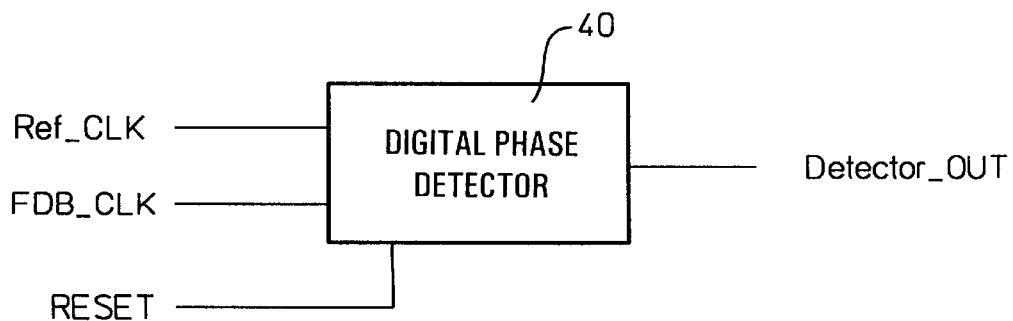
FIG. 3 shows an embodiment of the invention which includes a reset input.

FIG. 3 shows a digital phase detector 40 according to the invention which includes a reset input Reset. When activated, the reset Reset input places the digital phase detector 40 in a predefined state. Typically, the output Detector_Out is reset to a low voltage potential when the reset input Reset is activated. The reset input Reset can be activated to initialize the digital phase detector 40 to a known state. By avoiding instable conditions, phase-locked loops and delay-locked loops which include the digital phase detector 40 can lock faster.

Figure 4:
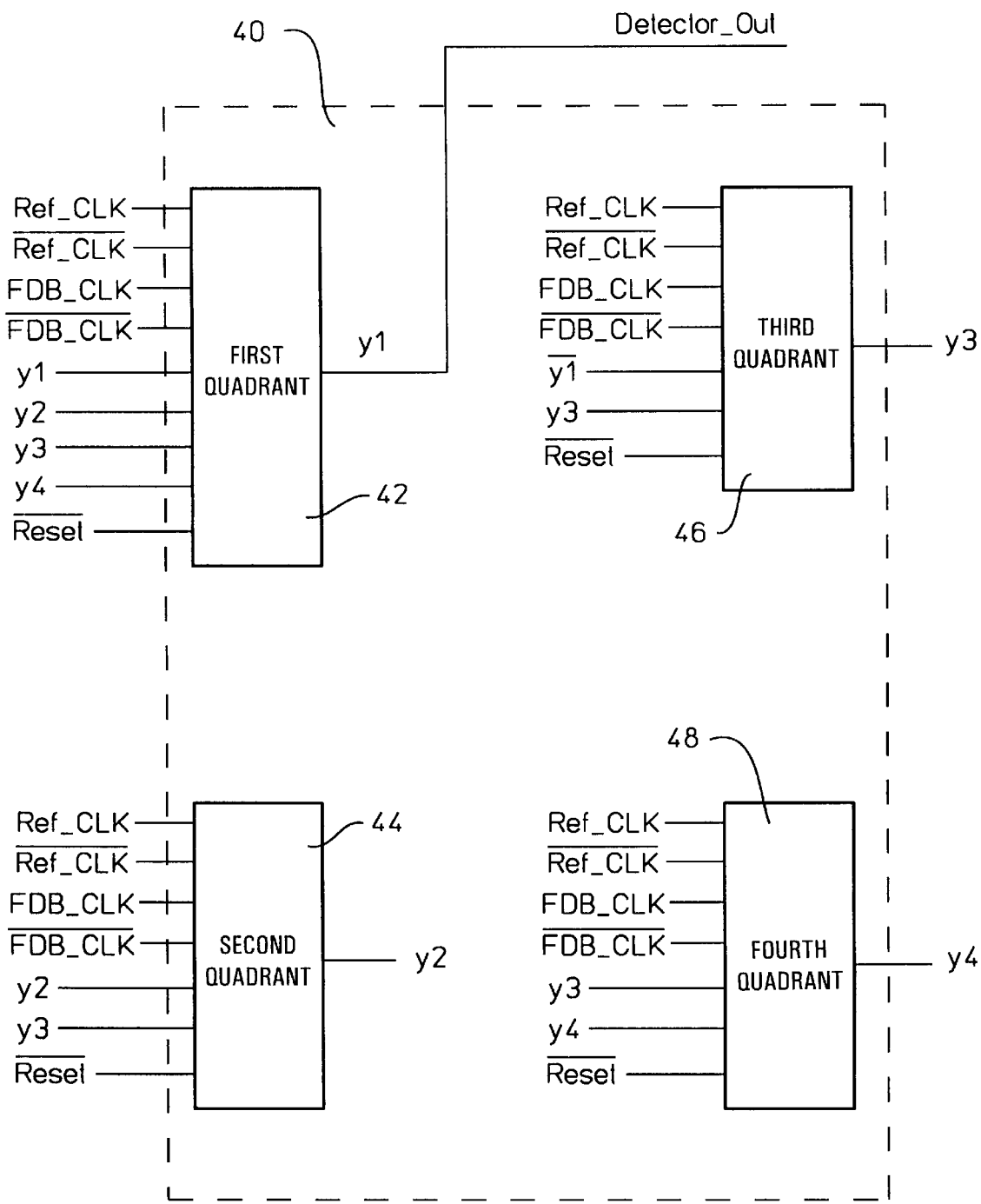
FIG. 4 shows an embodiment of the invention in which includes four quadrants of digital logic.

FIG. 4 shows an embodiment of the invention in which includes a digital phase detector 40 having four quadrants 42, 44, 46, 48 of digital logic. The digital logic within each quadrant 42, 44, 46, 48 is selected so that for a given fabrication process (for example, CMOS), the digital phase detector 40 is less sensitive to one input than the other. The reduced sensitivity acts to low pass filter the input signal. The digital phase detector receives a reference clock input Ref_CLK and a feedback signal input FDB_CLK. The digital phase detector 40 generates a detector output Detector_Out. Generally, the less sensitive input receives the reference clock input Ref_CLK which can be noisy. Reducing the sensitivity of one of the phase detector inputs improves the sensitivity of the phase detector which reduces the size of the dead zone.

A first quadrant 42 generates a first quadrant output y1. A second quadrant 44 generates a second quadrant output y2. A third quadrant 46 generates a third quadrant output y3. A fourth quadrant 48 generates a fourth quadrant output y4. The four quadrants 42, 44, 46, 48 can each be configured to receive the reference clock input Ref_CLK, the feedback signal input FDB_CLK, the first quadrant output y1, the second quadrant output y2, the third quadrant output y3, the fourth quadrant output y4, and the Reset signal This embodiment includes the digital phase detector output Detector_Out being the first quadrant output y1.

The logic within the first quadrant 42 is:

$$y1 = (\overline{Ref\_CLK \cdot FDB}\cdot y1 + \overline{Ref\_CLK} \cdot FDB\_CLK \cdot y2 + Ref\_CLK \cdot \overline{FDB\_CLK} \cdot y3 + Ref\_CLK \cdot \overline{FDB\_CLK} \cdot y4) \cdot \overline{Reset}.$$

The logic within the second quadrant 44 is:

$$y2 = (\overline{Ref\_CLK} \cdot FDB\_CLK \cdot y1 + Ref\_CLK \cdot FDB\_CLK \cdot y2) \cdot \overline{Reset}.$$

The logic within the third quadrant 46 is:

$$y3 = (\overline{Ref\_CLK} \cdot FDB\_CLK + \overline{Ref\_CLK} \cdot \overline{FDB\_CLK} \cdot y1 + Ref\_CLK \cdot FDB\_CLK \cdot y3) \cdot \overline{Reset}.$$

The logic within the fourth quadrant 48 is:

$$y4 = (\overline{Ref\_CLK} \cdot \overline{FDB\_CLK} + \overline{Ref\_CLK} \cdot FDB\_CLK + Ref\_CLK \cdot FDB\_CLK + Ref\_CLK + y1 + Ref\_CLK \cdot \overline{FDB\_CLK} \cdot y3) \cdot \overline{Reset}.$$

The embodiment shown in FIG. 4 includes four quadrants 42, 44, 46, 48 of logic. Four quadrants 42, 44, 46, 48 were selected due to ease of partitioning the required logic. However, more or less quadrants may be included as will become more apparent with the additional description of the operation of the invention as provided below.

Figure 2:
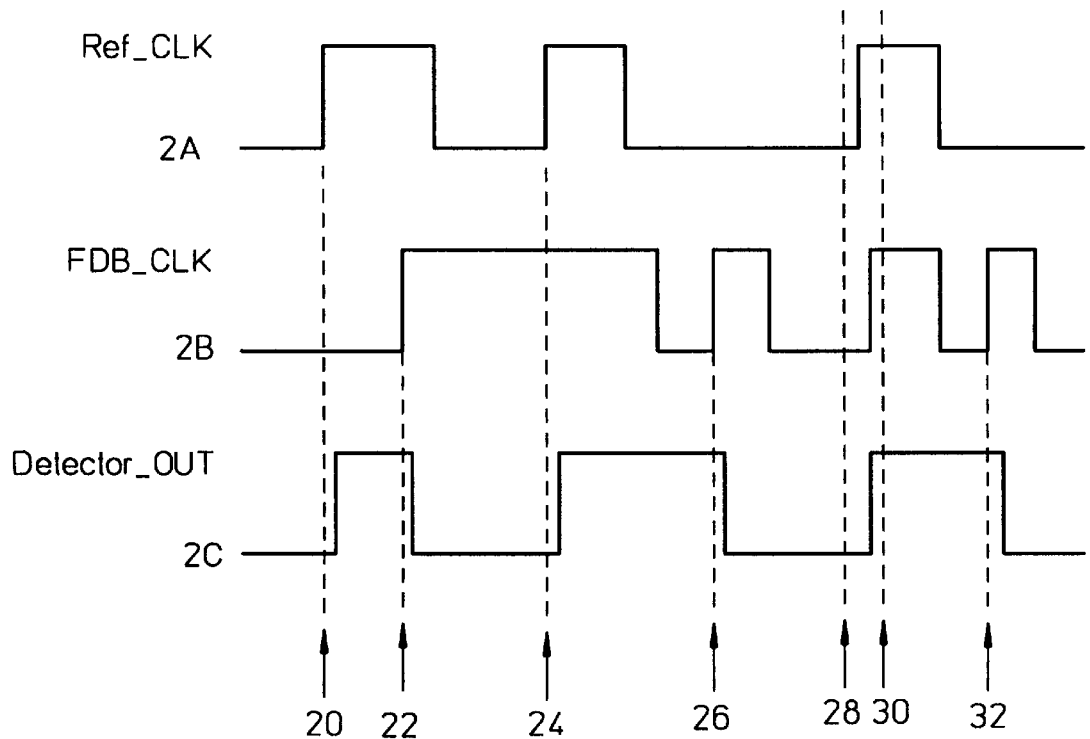
FIG. 2 shows waveforms which represent signals at the inputs and the output of the digital phase detector shown in FIG. 1.

The logic within each quadrant 42, 44, 46, 48 is selected so that the inputs connected to the phase detector will generate an output similar to Trace 2C of FIG. 2. A state diagram can be generated which includes a number of states which will ensure the desired functionality. The transition from one state to another is triggered by the occurrence of a positive transition of either the reference clock Ref_CLK or the feedback signal FDB_CLK inputs. From the state diagram, the required logic can be determined.

FIG. 5 is a state table which depicts the states of an asynchronous state machine of the invention. The table depicts present states and next states. The next states are dependent upon the status of the inputs of the digital phase detector. The output of the digital phase detector is dependent upon the state of the asynchronous state machine of the digital phase detector.

This embodiment includes four states S, T, U, V. State S corresponds to the first quadrant output y1 being 0 (low), the second quadrant output y2 being 0 (low), the third quadrant output y3 being 1 (high) and the fourth quadrant output y4 being 1 (high). State T corresponds to the first quadrant output y1 being 1 (high), the second quadrant output y2 being 0 (low), the third quadrant output y3 being 0 (low) and the fourth quadrant output y4 being 1 (high). State U corresponds to the first quadrant output y1 being 1 (high), the second quadrant output y2 being 1 (high), the third quadrant output y3 being 1 (high) and the fourth quadrant output y4 being 1 (high). State V corresponds to the first quadrant output y1 being 0 (low), the second quadrant output y2 being 0 (low), the third quadrant output y3 being 0 (low) and the fourth quadrant output y4 being 0 (low).

The table of FIG. 5 depicts the inputs Ref_CLK, FDB_CLK as 00, 01, 11 and 10.

These include all of the possible combinations of the inputs. The table also depicts the next states for each present state for each of the possible inputs. For example, for a present state S, the next state with an 00 input is S, the next state with an 01 input is S, the next state with an 11 input is U and the next state with an 10 input is T. The table also depicts the output Detector_Out for each of the next states. That is, the output Detector_Out is 0 (low) for state S, the output Detector_Out is 1 (high) for state T, the output Detector_Out is 1 (high) for state U, the output Detector_Out is 0 (low) for state V.

The information provided in FIG. 5 can be used to generate the logic required to implement the asynchronous state machine of the invention. The logic can be generated through hand calculations or through the use of a logic design application program. The logic can be divided into quadrants for ease of partition.

The sensitivity of the phase detector for various configurations of logic within each 30 quadrant 42, 44, 46, 48 is determined through computer aided design (CAD) simulation. Many different logic configurations are simulated to determined which configuration is optimal. That is, various logic configurations are simulated to determine which logic configuration yields a phase detector design having the smallest dead zone. Once the desired functionality of the logic has been determined, it is an iterative process to simulate the response of many possible logic configurations to determine which configuration is the best.

The placement of the logic circuitry on an integrated circuit substrate further affects the sensitivity of the phase detector and the dead zone. CAD simulations of the logic circuitry must include an iterative process of simulating many different configurations of layouts of the logic circuitry on an integrated circuit substrate. Both the logic configuration and the layout of the logic configuration on a substrate which provide the best phase detector sensitivity and the smallest dead zone is determined through CAD simulation.

The logic functions included within each of the quadrants 42, 44, 46, 48 are determined by the optimization process described above. Once the logic functions have been determined, the logic functions can be implemented according to many different digital logic synthesis methods.

Figure 6:
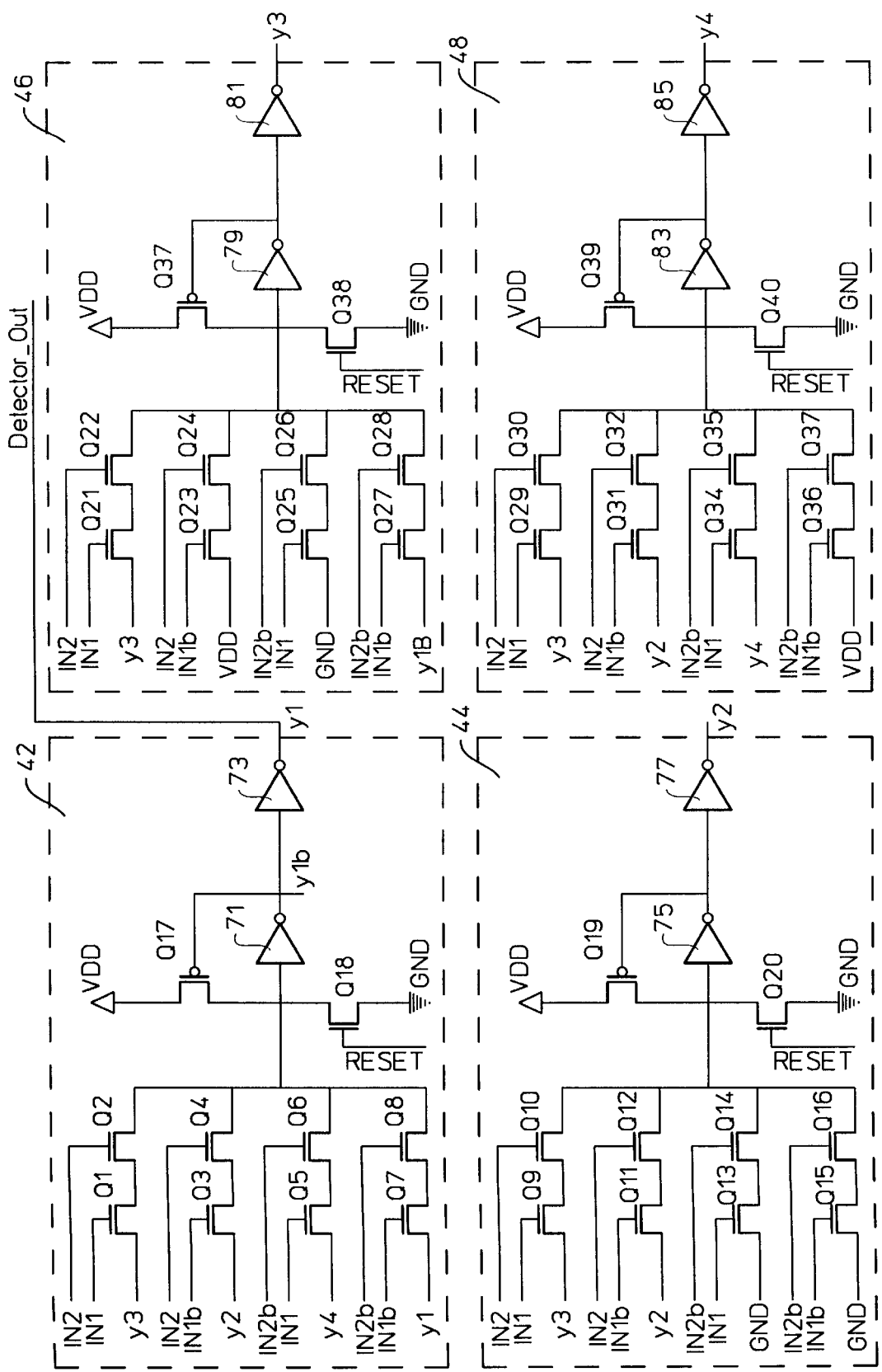
FIG. 6 shows another embodiment of the invention in which the logic functions shown in FIG. 4 have been implemented with pass-transistors.

FIG. 6 shows another embodiment of the invention in which the logic functions shown in FIG. 4 have been implemented with pass-transistors Q1–Q8, Q9–Q16, Q21–Q28, Q29–Q36, reset transistors Q18, Q20, Q38, Q40 and pull up transistors Q17, Q19, Q37, Q39. Implementation with pass-transistors offers several advantageous features. First, the delay of a signal passing through a pass transistor is minimal. Secondly, the widths of the pass-transistors of FIG. 6 can modified to fiurther to improve the sensitivity of the phase detector.

The input connections to each quadrant is different. However, the electronic circuitry within each quadrant is the same. The output of the digital phase detector is the output y1 of the first quadrant 42. The input connections to each quadrant are determined by the logic functions to be implemented by the quadrant.

In FIG. 6, the reference clock input is designated as IN1, and the feedback signal input is designated as IN2. FIG. 6 also includes signal designations IN1b, IN2b and y1b which are the IN1, IN2 and y1 inputs inverted.

The embodiment shown in FIG. 6 also includes invertors 71, 73, 75, 77, 79, 81, 83, 85. The invertors 71, 73, 75, 77, 79, 81, 83, 85 are standard two transistor invertors which include an N-channel FET and a P-channel FET. The embodiment shown in FIG. 5 further includes a power supply VDD and a circuit ground GND.

This embodiment includes equivalent transistors of each quadrant being the same size, but the transistors within each quadrant being variable sized. That is, Q1 of the first quadrant is the same size as Q9 of the second quadrant, Q21 of the third quadrant and Q29 of the fourth quadrant. However, Q1 of the first quadrant is not necessarily the same size as Q17 of the first quadrant. However, Q17 of the first quadrant is the same size as Q19 of the second quadrant, Q37 of the third quadrant and Q39 of the fourth quadrant.

An embodiment of the invention includes the digital phase detector being fabricated by a 0.35 micron technology fabrication process. This embodiment includes the channel lengths of transistors QI–Q16, Q18 being about 0.35 microns. Further, the channel lengths of the transistors within the invertors 71, 73 are all about 0.35 microns. The channel length of the pull up transistor Q17 is 2 microns. As was previously mentioned, the transistors in the second, third and fourth quadrants 44, 46, 48 are the same size as the equivalent transistors in first quadrant 42.

This embodiment includes the channel widths of transistors Q1–Q8 being 10 microns. Further, the channel width of transistor Q17 is 1 micron, the channel width of Q18 is 5 microns. The inverter 71 includes an N-channel FET having a channel width of 5 microns and a P-channel FET having a channel width of 10 microns. The inverter 73 includes an N-channel FET having a channel width of microns and a P-channel FET having a channel width of 16 microns.

As was previously mentioned, the logic within the four quadrants is selected to change the state of the digital phase detector asynchronous state machine upon the occurrence of a positive transition of either the Ref_CLK input or the FDB_CLK input. A first delay T1 is the delay time required for the Ref_CLK input to influence the output Detector_Out. A second delay T2 is the delay time required for the FDB_CLK input to influence the output Detector_Out. Both the first delay T1 and the second delay T2 define the dead zone of the digital phase detector. This embodiment includes the first delay time T1 being greater than the second delay time T2.

The first delay time T1 defines the dead zone of the digital phase detector if the output of the phase detector is low. The second delay time T2 defines the dead zone of the digital phase detector if the output of the phase detector is high. For the embodiment described, the first delay time T1 is approximately 250 picosecond, and the second delay time T2 is approximately 100 picoseconds.

CAD simulation can be used to determine channel widths of the pass transistors which improve the first delay time T1 and the second delay time T2. By allowing the channel widths of the pass transistor to vary from 5 microns to 15 microns, a first delay time of approximately 100 picoseconds and a second delay time of approximately 50 picoseconds have been measured. Therefore, the dead zone of the digital phase detector 40 has been correspondingly reduced. These measured delay time T1, T2 can be further reduced with greater CAD simulation.

Although specific embodiments of the invention have been described and illustrated, the invention is not to be limited to the specific forms or arrangements of parts so described and illustrated. The invention is limited only by the claims.

What is claimed is:

1. A phase detector comprising:

a phase compare logic block the phase compare logic block receiving a reference signal (RS) and a feedback signal (FS), the compare logic block generating an output signal at a first output potential when the reference signal transitions from a first voltage potential to a second voltage potential the compare logic block generating the output signal at a second potential when the feedback signal transitions from the first voltage potential to the second voltage potential, the compare logic block toggling the output signal between the first output potential and the second output potential when the reference signal and the feedback signal transition from the first voltage potential to the second voltage potential at substantially a same time; and wherein the phase compare logic block comprises an asynchronous state machine which changes states upon an occurrence of a negative transition of the reference signal, and upon an occurrence of a negative transition of the feedback signal.

2. A phase detector comprising:

a phase compare logic block, the phase compare logic block receiving a reference signal (RS) and a feedback signal (FS), the compare logic block generating an output signal at a first output potential when the reference signal transitions from a first voltage potential to a second voltage potential, the compare logic block generating the output signal at a second potential when the feedback signal transitions from the first voltage potential to the second voltage potential, the compare logic block toggling the output signal between the first output potential and the second output potential when the reference signal and the feedback signal transition from the first voltage potential to the second voltage potential at substantially a same time; and wherein the phase compare logic block comprises an asynchronous state machine which changes states upon an occurrence of a positive transition of the reference signal, and upon an occurrence of a positive transition of the feedback signal.

3. The phase detector as recited in claim 2, wherein the asynchronous state machine comprises pass-transistors.

4. The phase detector as recited in claim 3, wherein widths of the pass-transistors are adjusted to minimize a dead zone of the phase detector.

5. The phase detector as recited in claim 2, wherein the phase compare block comprises a first logic quadrant, a second logic quadrant, a third logic quadrant and a fourth logic quadrant.

6. The phase detector as recited in claim 5, wherein the first quadrant generates a first output (y1), the second quadrant generates a second output (y2), the third output generates a third output (y3) and the fourth quadrant generates a fourth output (y4), the first quadrant receiving the reference signal (RS), the feedback signal (FS), the second output (Y2), the third output (y3), the fourth output (y4), an inverted reference signal ($\overline{RS}$), an inverted feedback signal ($\overline{FS}$) and an inverted reset signal ($\overline{RST}$), the second quadrant receiving the reference signal (RS), the feedback signal (FS), the first output (y1), the third output (y3), the fourth output (y4), the inverted reference signal ($\overline{RS}$), the inverted feedback signal ($\overline{FS}$) and the inverted reset signal ($\overline{RST}$) the third quadrant receiving the reference signal (RS), the feedback signal (FS), the first output (y1), the second outout (y2), the fourth output (y4), the inverted reference signal ($\overline{RS}$), the inverted feedback signal ($\overline{FS}$) and the inverted reset signal ($\overline{RST}$), the fourth quadrant receiving the reference signal (RS), the feedback signal (FS), the first output (y1) the second output (y2), the third output (y3), the inverted reference signal ($\overline{RS}$), the inverted feedback signal ($\overline{FS}$) and the inverted reset signal ($\overline{RST}$).

7. The phase detector as recited in claim 6, wherein the first quadrant includes a logic function comprising:

$$y1=(\overline{RS}\cdot\overline{FS}\cdot y1+\overline{RS}\cdot FS\cdot y2+RS\cdot FS\cdot y3+RS\cdot\overline{FS}\cdot y4)\cdot\overline{RST}.$$

8. The phase detector as recited in claim 6, wherein the second quadrant includes a logic function comprising:

$$y2=(\overline{RS}\cdot FS\ y1+RS\cdot FS\cdot y2)\cdot\overline{RST}.$$

9. The phase detector as recited in claim 6, wherein the third quadrant includes a logic function $$y3=(\overline{RS}\cdot FS\ +\overline{RS}\cdot\overline{FS}\cdot y1+RS\cdot FS\cdot y3)\cdot\overline{RST}.$$

10. The phase detector as recited in claim 6, wherein the fourth quadrant includes a logic function function comprising:

$$y4=(\overline{RS}\cdot\overline{FS}+\overline{RS}\cdot FS+RS\cdot FS\cdot y1+RS\cdot\overline{FS}\cdot y3)\cdot\overline{RST}.$$

11. The phase detecter as recited in claim 2, wherein the phase compare block further comprises a reset signal (RST) which drives the output signal to the first output potential.

* * * * *